(12) United States Patent
Lee et al.

(10) Patent No.: US 11,908,826 B2
(45) Date of Patent: Feb. 20, 2024

(54) FLEXIBLE CLIP WITH ALIGNER STRUCTURE

(71) Applicant: SEMICONDUCTOR COMPONENTS INDUSTRIES, LLC, Phoenix, AZ (US)

(72) Inventors: Keunhyuk Lee, Suzhou (CN); Jerome Teysseyre, Scottsdale, AZ (US); Tiburcio A. Maldo, Consolacion (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 122 days.

(21) Appl. No.: 17/658,885

(22) Filed: Apr. 12, 2022

(65) Prior Publication Data
US 2023/0326902 A1   Oct. 12, 2023

(51) Int. Cl.
*H01L 23/00* (2006.01)
(52) U.S. Cl.
CPC .............. *H01L 24/72* (2013.01); *H01L 24/90* (2013.01)
(58) Field of Classification Search
CPC ........................................ H01L 24/72
USPC .......................................... 257/689
See application file for complete search history.

(56) References Cited

U.S. PATENT DOCUMENTS

| | | | |
|---|---|---|---|
| 4,935,803 A | 6/1990 | Kalfus et al. | |
| 7,095,113 B2 | 8/2006 | Xiaochun et al. | |
| 8,067,273 B2 | 11/2011 | Gomez | |
| 2022/0199602 A1* | 6/2022 | Baek | H01L 23/3735 |
| 2022/0238421 A1* | 7/2022 | Quinones | H01L 23/4334 |

\* cited by examiner

*Primary Examiner* — Ajay Arora
(74) *Attorney, Agent, or Firm* — Brake Hughes Bellermann LLP

(57) ABSTRACT

A clip preform includes a die contact portion and an aligner structure. An intermediate portion connects the die contact portion to a lead contact portion in the aligner structure. The die contact portion is configured to contact a semiconductor die. The aligner structure is configured to attach the lead contact portion to a lead post. The die contact portion, the intermediate portion, and the aligner structure form a structure of a primary clip for connecting the semiconductor die to the lead post. The clip preform is severable by removing parts of the die contact portion and the intermediate portion of the clip preform to form a secondary clip for connecting the semiconductor die to the lead post. The aligner structure, a remaining part of the die contact portion, and a remaining part of the intermediate portion of the clip preform form a structure of the secondary clip.

22 Claims, 10 Drawing Sheets

`US 11,908,826 B2`

FLEXIBLE CLIP WITH ALIGNER STRUCTURE

TECHNICAL FIELD

This disclosure relates to packaging or semiconductor devices such as power metal-oxide-semiconductor field-effect transistor (MOSFET) devices

BACKGROUND

High-power semiconductor modules and packages are often assembled using a clip-bonding technology to meet requirements of increasing power levels and power density requirements for multiple end products. Clip-bonding technology can replace a standard wire-bond connection between a semiconductor die and an external lead by a solid metal bridge (clip). For example, a solid metal (e.g., copper) clip attached to the die surface can replace multiple bonded wires between the die surface and the external lead. The clip connection offers several benefits including a reduction of the overall package resistance of the product when compared to metal wire. Clip-bonding can allow, for example, for unique package resistance, better thermal transfer, and ultra-fast switching performance.

SUMMARY

A clip preform includes a die contact portion having a planar surface, an aligner structure including a lead contact portion having a planar surface, and an intermediate portion connecting the die contact portion to the lead contact portion in the aligner structure. The die contact portion is disposed at a first distal end of the clip preform and the aligner structure is disposed at an opposite second distal end of the clip preform. The planar surface of die contact portion is configured to contact a surface of a semiconductor die. The aligner structure is configured to attach the lead contact portion to a lead post. The die contact portion, the intermediate portion, and the aligner structure of the clip preform form a structure of a primary clip for connecting the semiconductor die to the lead post. The clip preform is severable by removing a part of the die contact portion and a part of the intermediate portion of the clip preform to form a secondary clip for connecting the semiconductor die to the lead post. The aligner structure, a remaining part of the die contact portion, and a remaining part of the intermediate portion of the clip preform form a structure of the secondary clip.

A primary clip includes an aligner structure configured to attach a lead contact portion to a lead post, a die contact portion configured to contact a surface of a semiconductor die, and an intermediate portion connecting the die contact portion to the lead contact portion in the aligner structure. The die contact portion has a surface downset from a surface of the lead contact portion and a first lateral width. The primary clip includes at least a secondary clip formed by removal of a part of the die contact portion, the die contact portion remaining in the secondary clip having a second lateral width that is smaller than the first lateral width.

A clip frame includes a pair of spaced-apart holed runner strips, and a clip held by tie bars between the pair of spaced-apart holed runner strips. The clip includes an aligner structure configured to attach a lead contact portion to a lead post, a die contact portion configured to contact a surface of a semiconductor die, and an intermediate portion connecting the die contact portion to the lead contact portion in the aligner structure. The die contact portion includes a surface downset from a surface of the lead contact portion, and has a first lateral width. The clip includes at least a secondary clip formed by removal of a part of the die contact portion. A remaining die contact portion remaining in the secondary clip has a second lateral width that is smaller than the first lateral width.

A method includes receiving a semiconductor die, receiving a leadframe including a lead post, and receiving a clip frame holding a primary clip by tie bars attached to the primary clip.

The primary clip includes an aligner structure configured to attach the primary clip to the lead post and a flat die contact portion having a first width coupled to the clip aligner structure. The primary clip is severable into at least a secondary clip. The secondary clip includes a part of flat die contact portion having a second width.

The method includes determining a width of a contact pad on the semiconductor die. The method further includes, when the width of the contact pad matches the first width of the flat die contact portion of the primary clip, extracting the primary clip from the clip frame and attaching the primary clip to the contact pad on the semiconductor die. The method also includes, when the width of the contact pad matches the second width of the part of flat die contact portion in the secondary clip, extracting the secondary clip from the clip frame and attaching the secondary clip to the contact pad on the semiconductor die.

The details of one or more implementations are set forth in the accompanying drawings and the description below. Other features will be apparent from the description and drawings, and from the claims.

BRIEF DESCRIPTION OF THE DRAWINGS

Like reference characters or numerals represent like elements throughout the various drawings.

DETAILED DESCRIPTION

Electrical vehicle (EV)/Hybrid Electrical Vehicle (HEV) automotive product applications (e.g., for Power Train Inverters, DC-DC converters, on board chargers (OBC), etc.) now can include silicon carbide (SiC) based devices in addition to silicon (Si) based devices. The SiC devices often have different sizes (e.g., source pad sizes) than, for example, the Si based devices.

The semiconductor devices for various product applications may be packaged in industry-standard package types. Packaging the different size devices or semiconductor die in an industry-standard package type in a common fabrication facility, can be problematic. The packaging assembly lines may have to be provisioned with multiple supply lines, for example, for different size connection clips, and with multiple tool sets (e.g., clip-bonders) for connecting the different size connection clips to contact pads (e.g., source pads) in different products. A different clip design may be needed for each product, and a higher tooling investment may be required as compared to packaging of wired products.

A clip preform can supply different sizes of clips for making clip connections to different size contact pads (e.g., source pads) in different semiconductor die products, in accordance with the priniciples of the present disclosure. The clip preform can be severable into clips of different shapes and sizes. The clip preform may be severed (e.g., singulated) to locally (e.g., at clip bonding station in a packaging assembly line) obtain clips of different sizes as needed, for example, to match different size contact pads (e.g., source pads) in different semiconductor die products.

The clip preform may be fabricated, for example, by stamping and cutting a sheet of metal (e.g., a copper sheet, an aluminum sheet, etc.). In example implementations, the clip preform may be severable into different primary and secondary clips for different size contacts with semiconductor die. The clip preform may be severed, as needed, into primary or secondary clips to match the different sizes of contact pads (e.g., source pads) in the different semiconductor die.

Figure 1A:
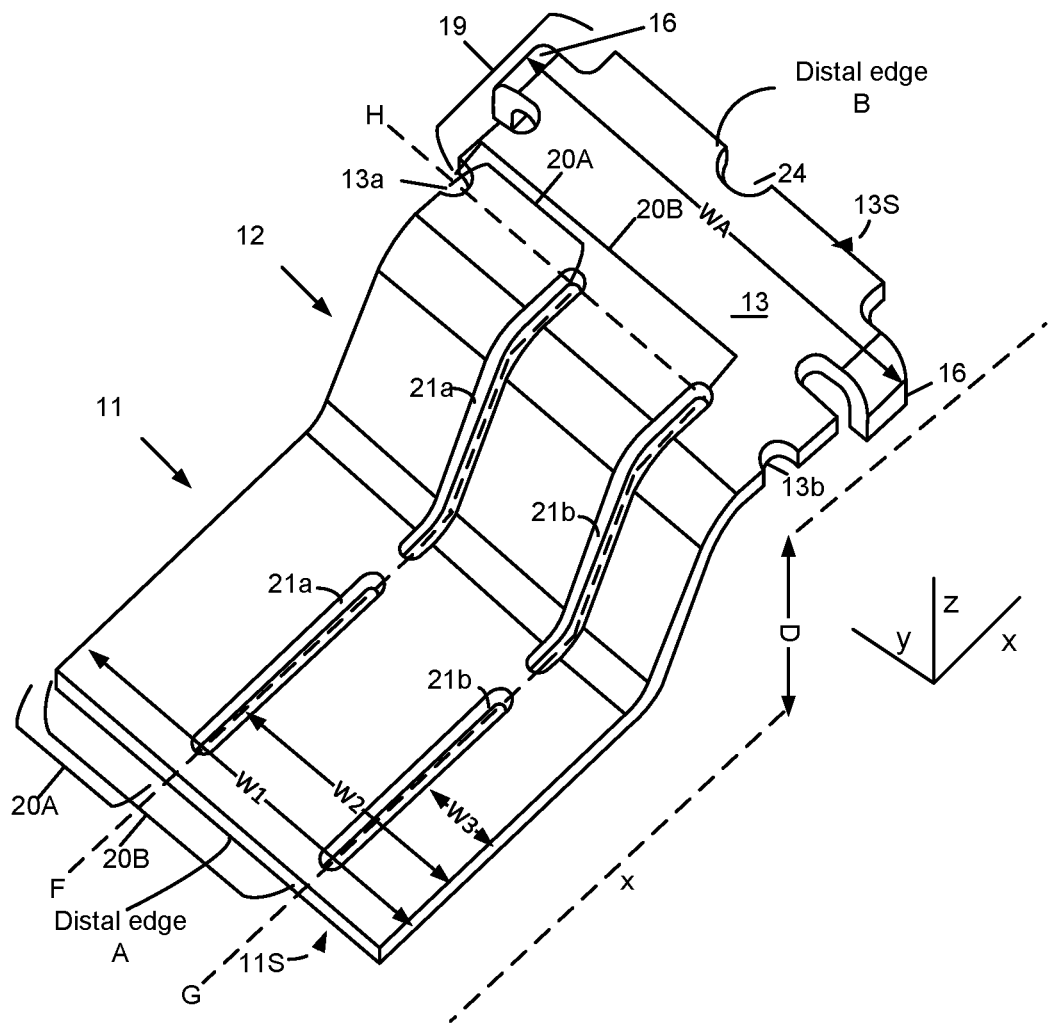
FIG. 1A and FIG. 1B respectively illustrate a perspective view and a bottom view of an example clip preform.
Figure 1B:
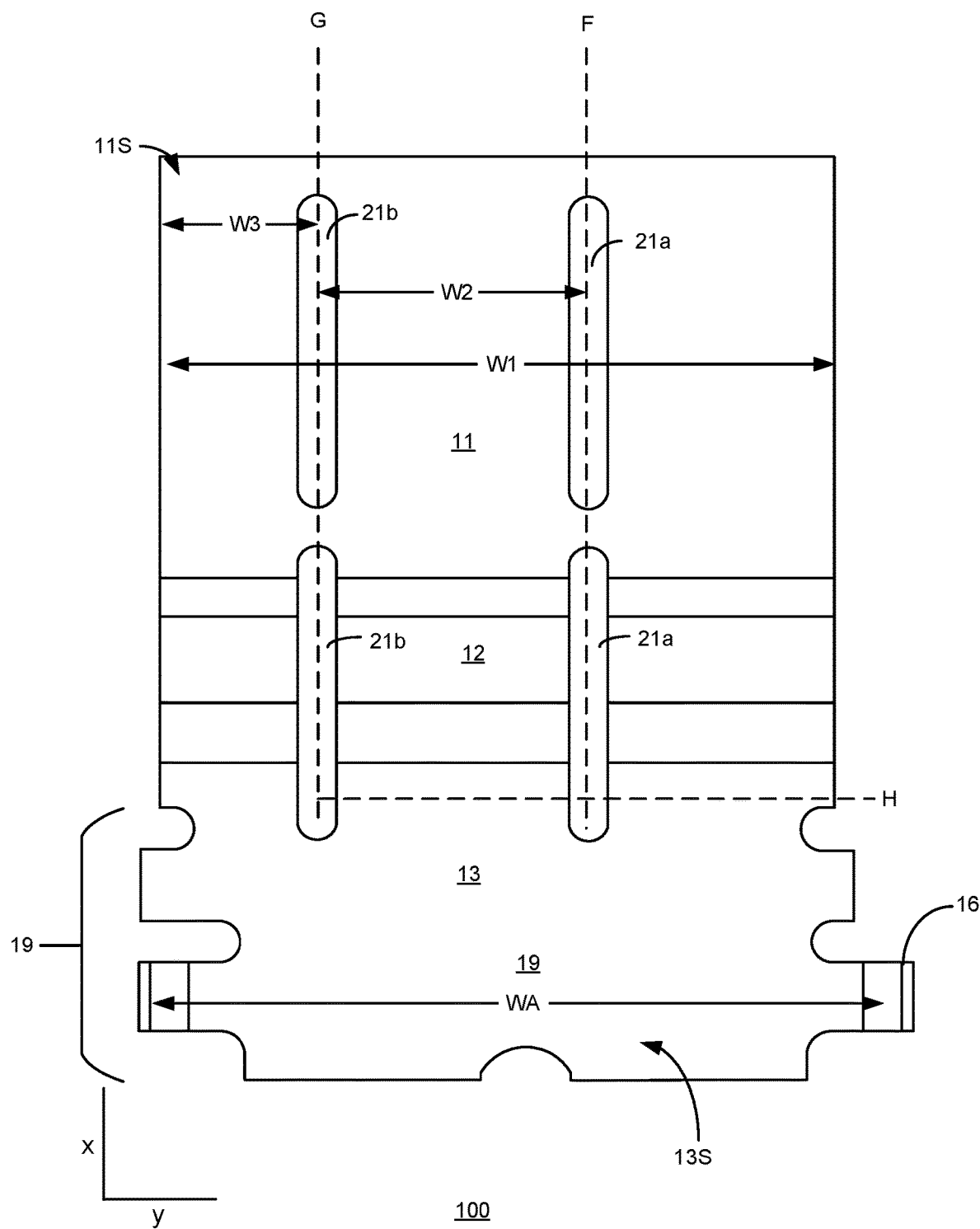

FIG. 1A and FIG. 1B show a perspective view and a bottom plan view, respectively, of an example clip preform 100 that is severable into different clips for different size contacts, in accordance with the principles of the present disclosure.

As shown in FIGS. 1A and 1B, clip preform 100 includes a die contact portion 11 disposed at a first distal edge A of the clip preform, and an aligner structure 19 disposed at an opposite second distal edge B of the clip preform.

Die contact portion 11 may be a flat sheet of metal (e.g., with a major planar surface 11S) extending, for example, in an x-y plane. Die contact portion 11 may, for example, have a lateral width W1 (e.g., in the y direction). Die contact portion 11 may be configured to electrically and mechanically contact a surface (e.g., a source pad) of a semiconductor die.

Aligner structure 19 disposed at the opposite second distal edge B of the clip preform may include a lead contact portion 13.

Lead contact portion 13 may be a flat sheet of metal (e.g., with a major planar surface 13S) extending, for example, in the x-y plane. Lead contact portion 13 may, for example, have about a same lateral width WA (e.g., in the y direction) as aligner structure 19. In this implementation, the lateral width WA of the lead contact portion 13 is greater than a width than other portions of the aligner structure 19. In some implementations, the lateral width WA of the lead contact portion 13 can be the same as or less than a width than other portions of the aligner structure 19.

Aligner structure 19 may be configured to attach lead contact portion 13 to a lead post of a leadframe (e.g., lead post 53L, leadframe 50, FIGS. 5A-5C) in a semiconductor die package. For this purpose, aligner structure 19 may, for example, include structural features (e.g., vertical walls or tabs 16, notch 24, etc.) that may form a cavity (not shown) to guide or hold lead contact portion 13 in mechanical and electrical contact with the lead post. Vertical walls or tabs 16 may function as a locking feature for positioning and holding aligner structure 19 in contact with the lead post (e.g., lead post 53L, leadframe 50, FIGS. 5A-5C).

Further, clip preform 100 includes an intermediate portion 12 connecting die contact portion 11 to lead contact portion 13 in aligner structure 19. In clip preform 100, a major planar surface (e.g., surface 11S) of die contact portion 11 may be downset from a major planar surface (e.g., surface 13S) of lead contact portion 13 by a distance perpendicular (e.g., distance D in the z direction) to the major planar surfaces. In some implementations intermediate portion 12 may be down sloped and may decrease in height (e.g., in the z-direction) from lead contact portion 13 to die contact portion 11 by the downset distance (e.g., distance D in the z direction).

In this implementation, the intermediate portion 12 is aligned along a plane not orthogonal to or aligned with planes aligned along other portions (e.g., die contact portion 11 and lead contact portion 13) of the clip preform 100. The surface 11S is aligned along a plane parallel to a plane along which the surface 13S is aligned.

Die contact portion 11, intermediate portion 12, and aligner structure 19 (including lead contact portion 13) in clip preform 100 may form an integral structure of a primary clip (e.g., primary clip 200A, FIG. 2A) for connecting the semiconductor die to the lead post. In some implementations, the die contact portion 11, intermediate portion 12, and aligner structure 19 can be monolithically formed from a conductive material such as a metal.

In example implementations, clip preform 100 (primary clip 200A) may be severable, for example, by removing (e.g., cutting or singulating out) a part of the die contact portion 11 and/or the intermediate portion 12 of clip preform 100 to form a secondary clip for connecting the semiconductor die to the lead post. Aligner structure 19, and the unremoved (e.g., remaining) parts of die contact portion 11 and intermediate portion 12 of clip preform 100 may form an integral structure of the secondary clip (e.g., secondary clip 200B, FIG. 2B, secondary clip 200C, FIG. 2C).

In the example implementation shown in FIGS. 1A and 1B, the removable parts (e.g., removable part 20A and removable part 20B including the removable parts of the die contact portion and the intermediate portion) of clip preform 100 that can be removed are, for purposes of illustration, indicated by braces labelled 20A and 20B. Further, edges or boundaries between the removable parts and the unremoved (e.g., remaining) parts are pictorially delineated, for example, by cutting lines F, G, and H. Cutting lines F and G may, for example, be directed in a longitudinal direction (e.g., x direction) from distal edge A toward distal edge B. Cutting line H may, for example, extend in a lateral direction (e.g., y direction) across a portion of lead contact portion 13 until (i.e., cutting line H's) intersecting with either cutting line F (for removing removable part 20A) or cutting line G (for removing removable part 20B).

In some implementations, the cutting line H intersects only one of cutting line F or cutting line G and a separate laterally directed cutting line intersects the remaining cutting line of cutting line F or G. Accordingly, cutting line H can be used to form a secondary clip and the separate laterally directed cutting line can be used to form a different secondary clip.

As shown in FIGS. 1A and 1B, the cutting lines F and G include at least two slots. In some implementations, the cutting lines F and G can include less than two slots or more than two slots. In some implementations, one or more of the cutting lines F and G include a slot that is entirely disposed within the die contact portion 11. In some implementations, one or more of the cutting lines F and G include a slot that is extends entirely across the intermediate portion 12 and extends into the die contact portion 11 and/or the lead contact portion 13. In some implementations, one or more of the cutting lines F and G include a slot that is entirely disposed within the intermediate portion 12 and does not extend into the die contact portion 11 and/or the lead contact portion 13.

When removable part 20A of clip preform 100 is removed, the unremoved (e.g., remaining) part of die contact portion 11 may have a lateral width W2 (which is smaller than width W1 of die contact portion 11 in the primary clip). Aligner structure 19, and the unremoved parts of die contact portion 11 and intermediate portion 12 of clip preform 100 may form an integral structure of a secondary clip (e.g., secondary clip 200B, FIG. 2B).

When removable part 20B of clip preform 100 is removed, the unremoved part of die contact portion 11 may have a lateral width W3 (which is smaller than width W1 of die contact portion 11 in the primary clip). Aligner structure 19, and the unremoved parts of die contact portion 11 and intermediate portion 12 of clip preform 100 may form an integral structure of another secondary clip (e.g., secondary clip 200C, FIG. 2C).

Figure 2A:
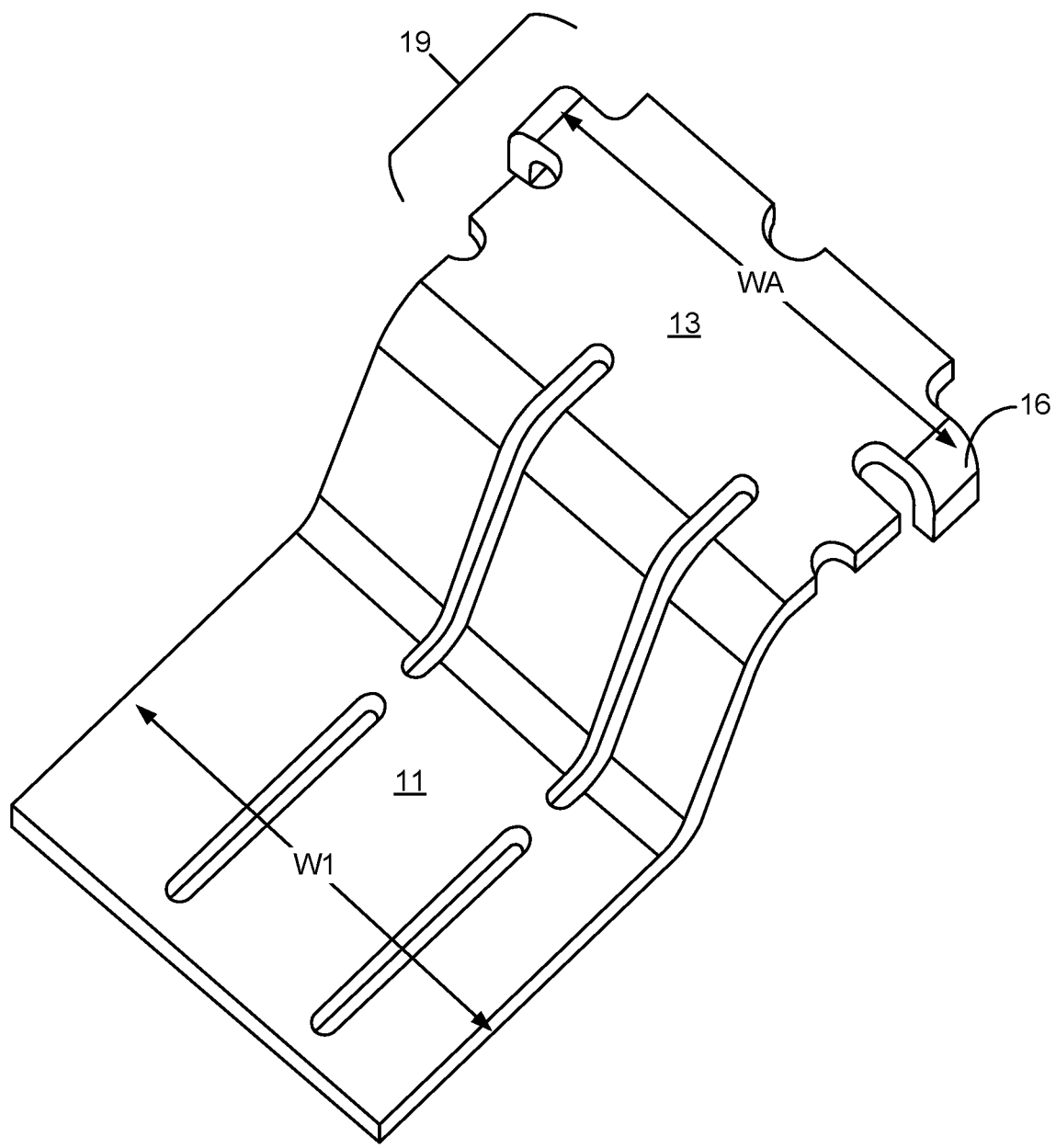
FIGS. 2A, 2B and 2C illustrate perspective views of different primary and secondary clips that may be extracted or singulated from a clip preform.
Figure 2B:
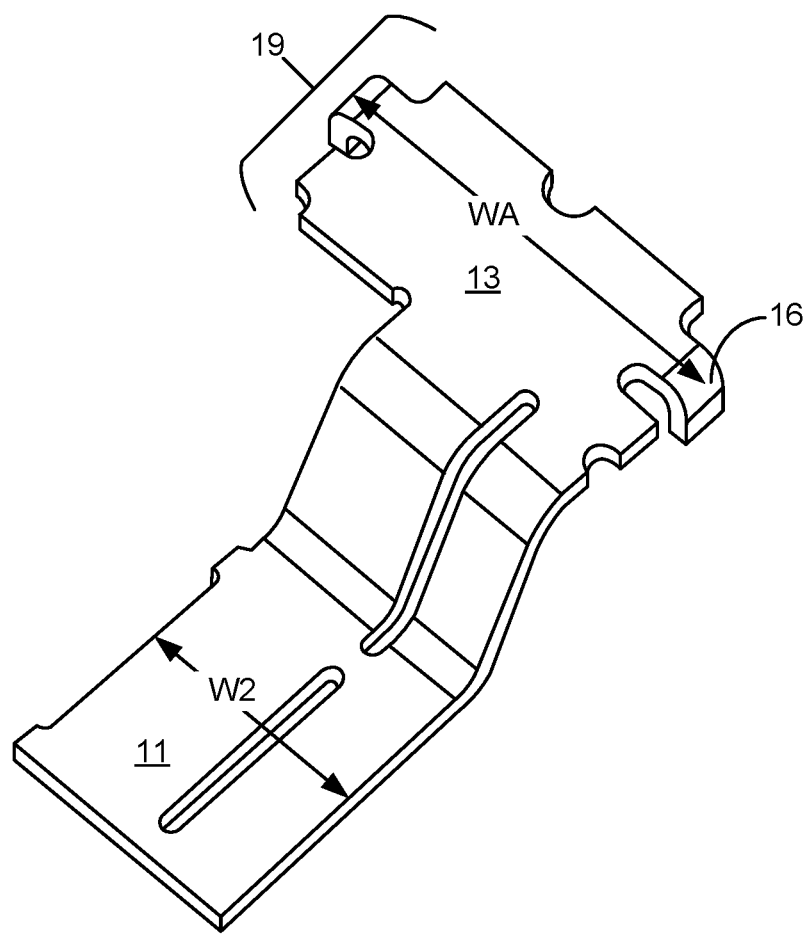
Figure 2C:
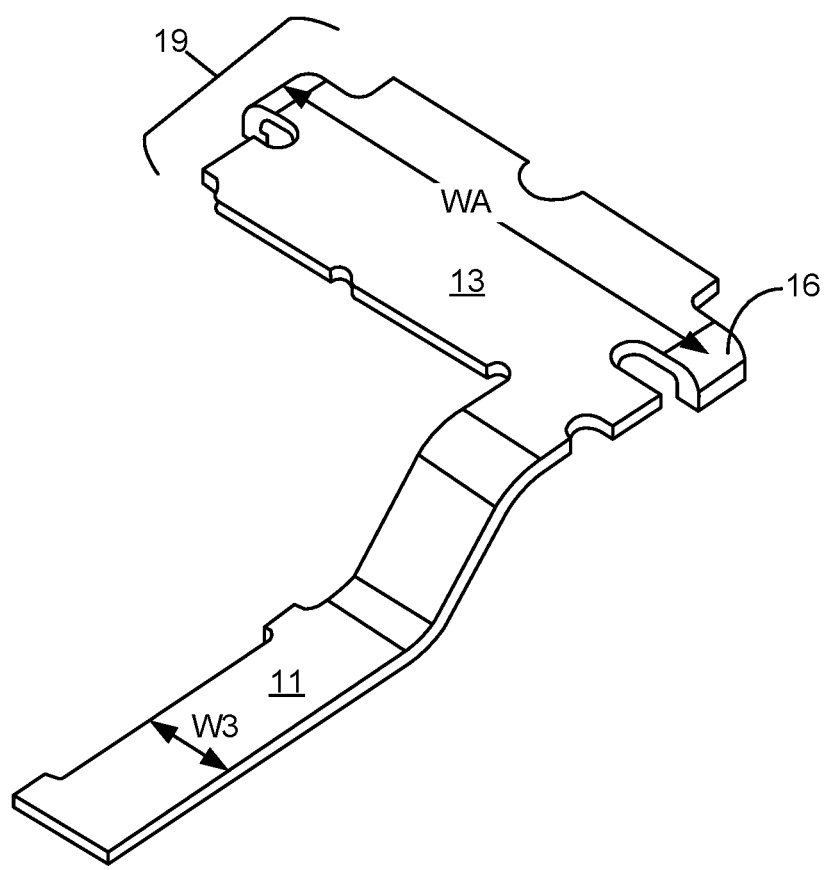

In example implementations, clip preform 100 may include one or more singulation guides or markings on the primary clip identifying the parts of the die contact portion and the parts of the intermediate portion to be removed from the primary clip to form the secondary clips (e.g., secondary clip 200B, FIG. 2B secondary clip 200C, FIG. 2C, etc.). In some implementations, the second clip 200C can be referred to as a tertiary clip.

In some example implementations, the one or more singulation guides or markings may include at least a slot formed along a portion of an edge or boundary of a part that can be removed from clip preform 100 to form the secondary clip. FIGS. 1A and 1B show, for example, longitudinal slots 21a disposed in clip preform 100 along a boundary (e.g., cutting line F) of removable part 20A, and longitudinal slots 21b disposed in clip preform 100 along a boundary (e.g., cutting line G) of removable part 20B. The slots may make it easier to singulate clip preform 100, for example, by easing placement or alignment of cutting tools, or reducing the amount of material that may need to be cut through in the x-direction (e.g., along cutting lines F or G) to remove the removable parts 20A or 20B. Further, in some example implementations, the singulation guides or markings may include one or more guide notches (e.g., guide notch 13a, 13b) disposed on a lateral edge of lead contact portion 13. The guide notches (e.g., guide notch 13a) may be configured to position, align, and guide a cutting or singulation tool to cut the clip preform along a line (e.g., cutting line H) perpendicular to the lateral edge of lead contact portion 13.

FIGS. 2A, 2B and 2C shows perspective views of different clips that may be extracted or obtained from clip preform 100.

FIG. 2A shows a primary clip 200A which includes all of the portions of clip preform 100 shown in FIGS. 1A and 1B. No portions (i.e., die contact portion 11, intermediate portion 12, and aligner structure 19 (including lead contact portion 13) in clip preform 100 are removed or modified to obtain primary clip 200A. The aligner structure 19 in primary clip 200A is the same as aligner structure 19 in clip preform 100.

The lateral width (i.e., W1) of die contact portion 11 in primary clip 200A is the same as the lateral width of die contact portion 11 in clip preform 100. The aligner structure 19 in primary clip 200A is the same as aligner structure 19 in clip preform 100.

FIG. 2B shows a secondary clip 200B which is obtained from clip preform 100 by removing removeable part 20A from the portions of clip preform 100 shown in FIGS. 1A and 1B. The aligner structure 19 in secondary clip 200B is the same as aligner structure 19 in clip preform 100 (and primary clip 200A, FIG. 2A). The lateral width (i.e., W2) of die contact portion 11 in secondary clip 200B is smaller than the lateral width (i.e., W1) of die contact portion 11 in primary clip 200A.

FIG. 2C shows a secondary clip 200C which is obtained from clip preform 100 by removing removeable part 20B from the portions of clip preform 100 shown in FIGS. 1A and 1B. The aligner structure 19 in secondary clip 200C is the same as aligner structure 19 in clip preform 100. The lateral width (i.e., W3) of die contact portion 11 in secondary clip 200C is smaller than the lateral width (i.e., W1) of die contact portion 11 in primary clip 200A. The secondary clip 200C shown in FIG. 2C has a surface area and width W3 smaller than a surface area and width W2 of the secondary clip 200B shown in FIG. 2B.

In example implementations, clip preform 100 may be singulated to extract the primary clip or the secondary clip structures. Trim-and-form tooling (e.g., attached to an automated pick-and-place machine) may be used, for example, to singulate clip preform 100 in the clip-die bonding processes. In example implementations, clip preform 100 may be singulated to extract the primary clip or the secondary clip structures, for example, at a clip-semiconductor die bonding station in a packaging assembly line.

In example implementations, for automated (or partially automated) processing, an array of clip preforms (e.g., clip preforms 100) may be supplied (e.g., to a clip bonding tool) on a reeled clip frame. The array of clip preforms (e.g., clip preforms 100) can be held in a reeled frame between a pair of spaced-apart runner strips with indexing holes. The reeled frame including the array of clip preforms may be fabricated by stamping and cutting a strip of sheet metal (e.g., a copper or aluminum sheet).

Figure 3:
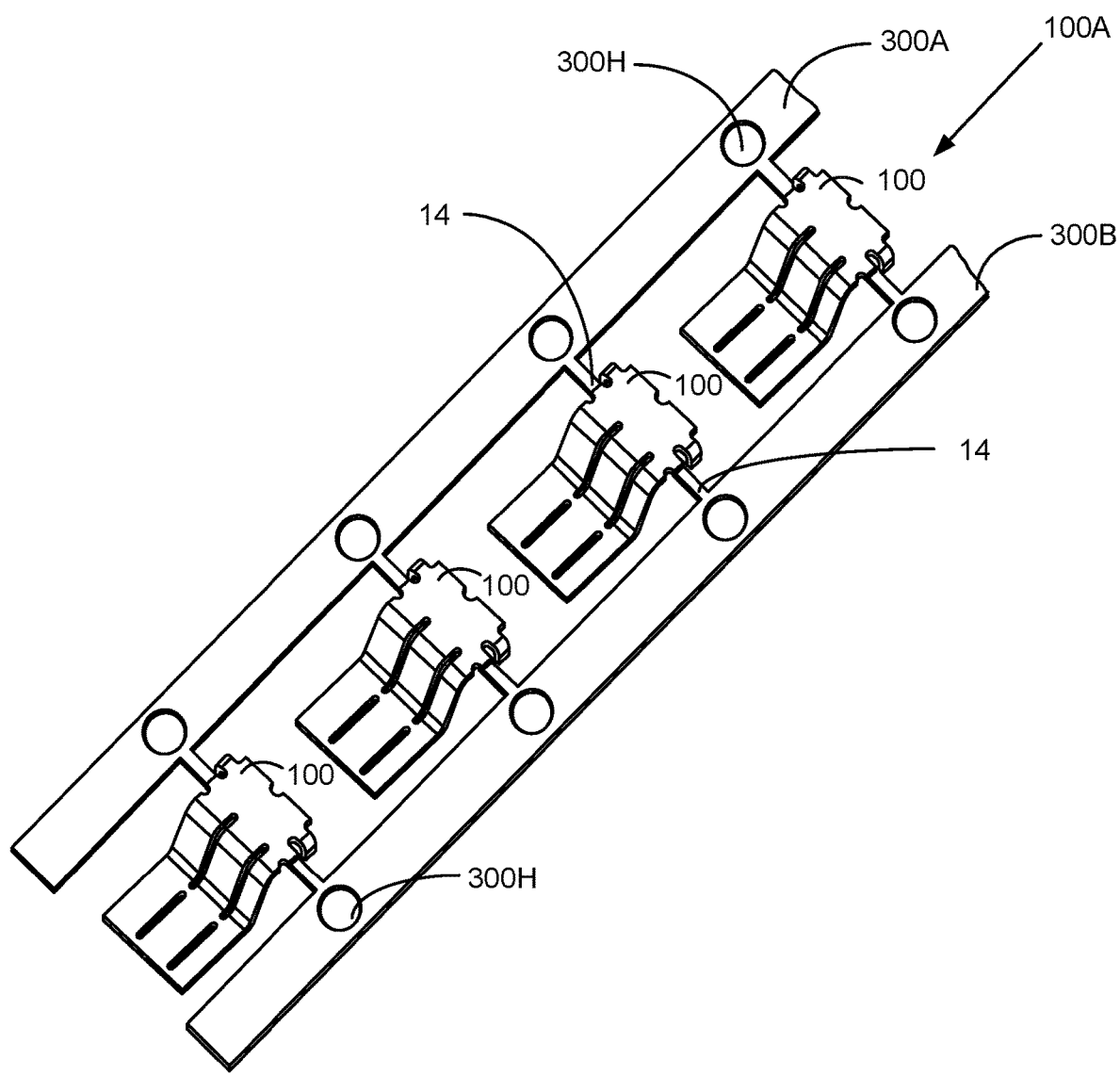
FIG. 3 illustrates an example clip frame including an array of clip preforms.

FIG. 3 shows an example reeled clip frame 300 including an array of clip preforms.

As shown in FIG. 3, clip frame 300 may include a pair of spaced-apart holed runner strips 300A, 300B. An array 100A of clip preforms 100 may be held between the spaced-apart holed runner strips. Individual clip preforms 100 in the array may be held between the pair of spaced-apart holed runner strips by tie bars 14 attached to clip preforms 100 and the runner strips. One or both of the runner strips may include indexing holes 300H to assist in positioning and aligning clip frame 300 in processing tools (e.g., a clip bonding tool).

Figure 4:
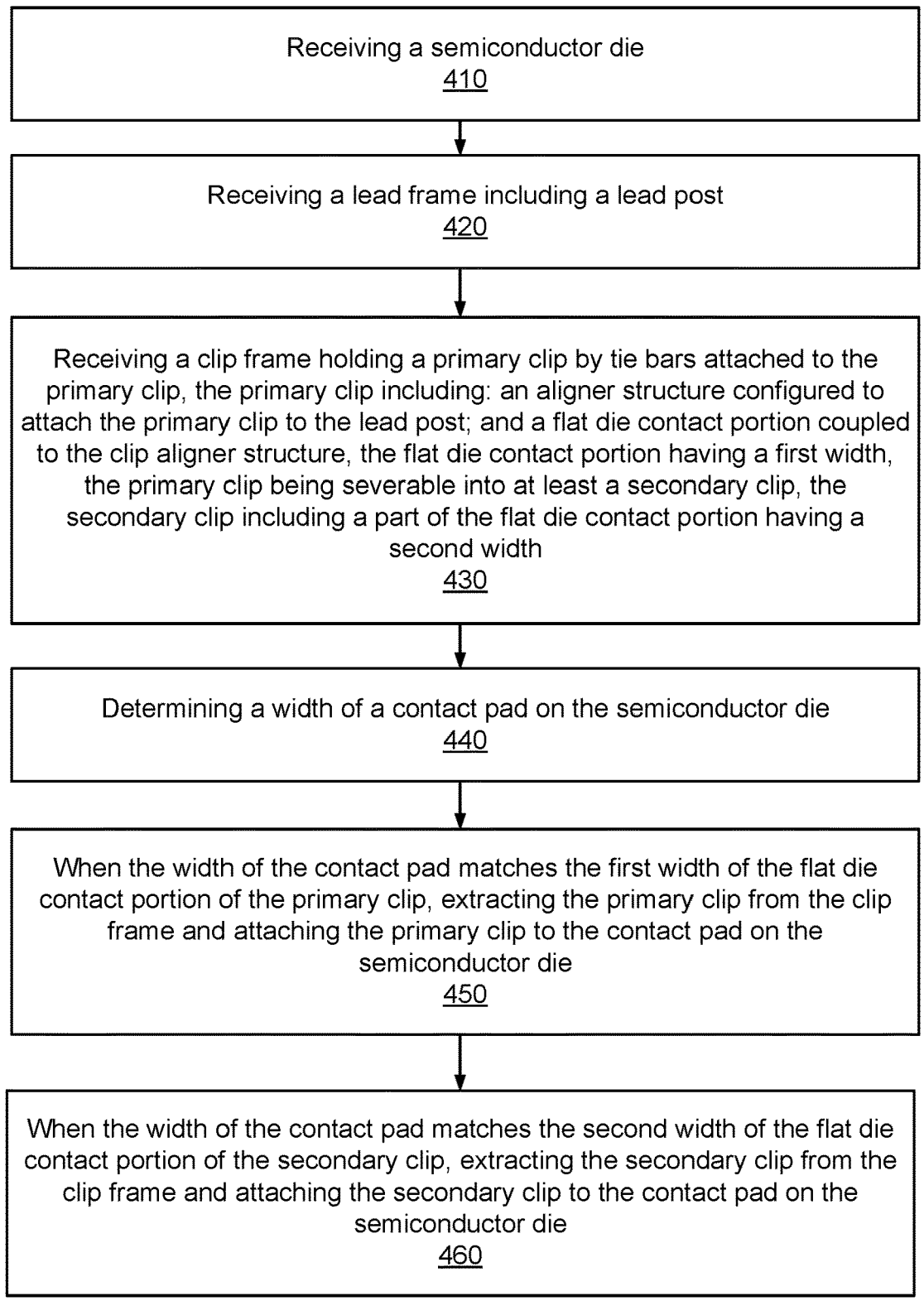
FIG. 4 illustrates an example method for packaging a semiconductor device die.

FIG. 4 illustrates an example method 400 for packaging a semiconductor device die. Method 400 includes receiving a semiconductor die (410) and receiving a leadframe including a lead post (420). The leadframe may be a leadframe of a type with dimensions and connection structures (e.g., a number of leads, pins, and sizes) defined, for example, by an industry standard for a semiconductor device package. Method 400 further includes receiving a clip frame holding a primary clip by tie bars attached to the primary clip (430). The primary clip includes an aligner structure configured to attach the primary clip to the lead post, and a flat die contact portion coupled to the aligner structure. The flat die contact portion has a first width (e.g., W1). The primary clip is severable into at least a secondary clip. The secondary clip includes a part of the flat die contact portion having a second width (e.g., W2 or W3). Method 400 further includes determining a width of a contact pad on the semiconductor die (440).

Method 400 next includes, when the width of the contact pad on the semiconductor die matches the first width of the flat die contact portion of the primary clip, extracting the primary clip from the clip frame and attaching the primary clip to the contact pad on the semiconductor die (450), and when the width of the contact pad matches the second width of the part of flat die contact portion in the secondary clip, extracting the secondary clip from the clip frame and attaching the secondary clip to the contact pad on the semiconductor die (460).

Extracting the secondary clip from the clip frame 460 includes singulating the primary clip to remove a section of the flat die contact portion in primary clip while keeping the part of flat die contact portion having a second width in the secondary clip.

Extracting the primary clip and the secondary clip from the clip frame may include singulating the tie bars holding the primary clip in the clip frame. Further, attaching the primary clip to the semiconductor die, and attaching the secondary clip to the semiconductor die, may each include attaching the clip aligner structure to the lead post.

Method 400 may be applied in scenarios where the contact pad on the semiconductor die is a source contact pad of a device in the semiconductor die.

Figure 5A:
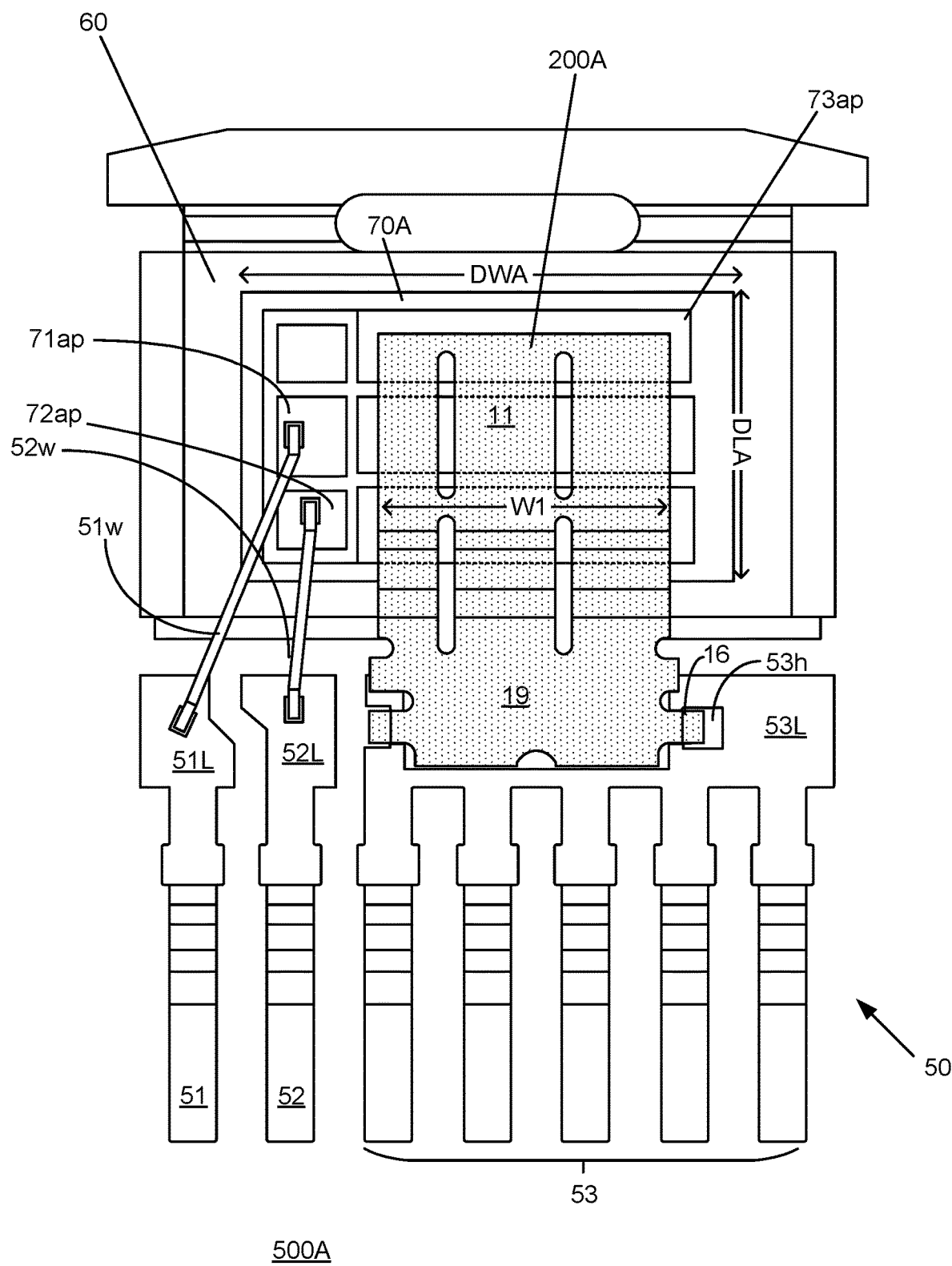
FIGS. 5A through 5C illustrate use of clips of different sizes to connect to semiconductor die in a semiconductor device package.
Figure 5B:
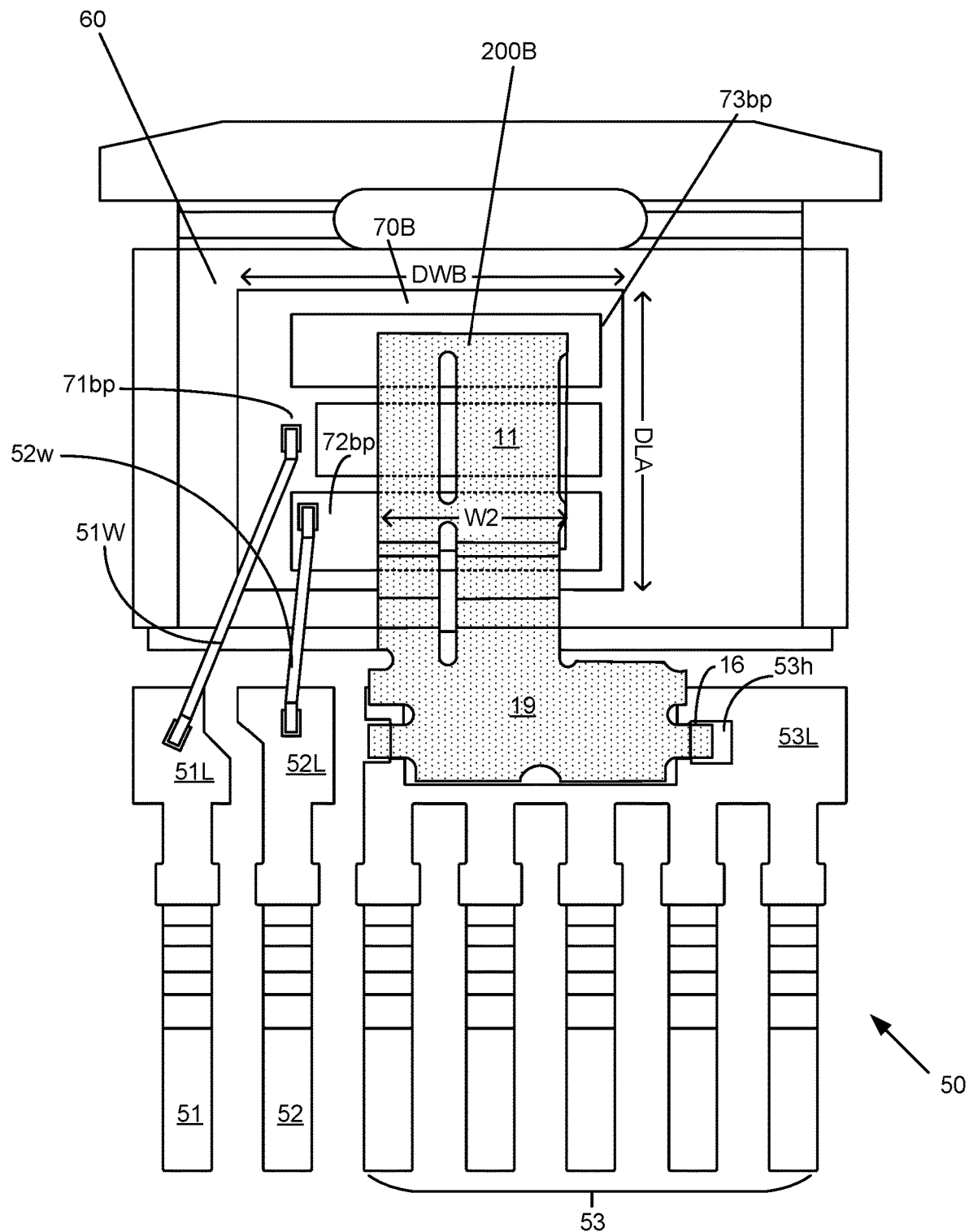
Figure 5C:
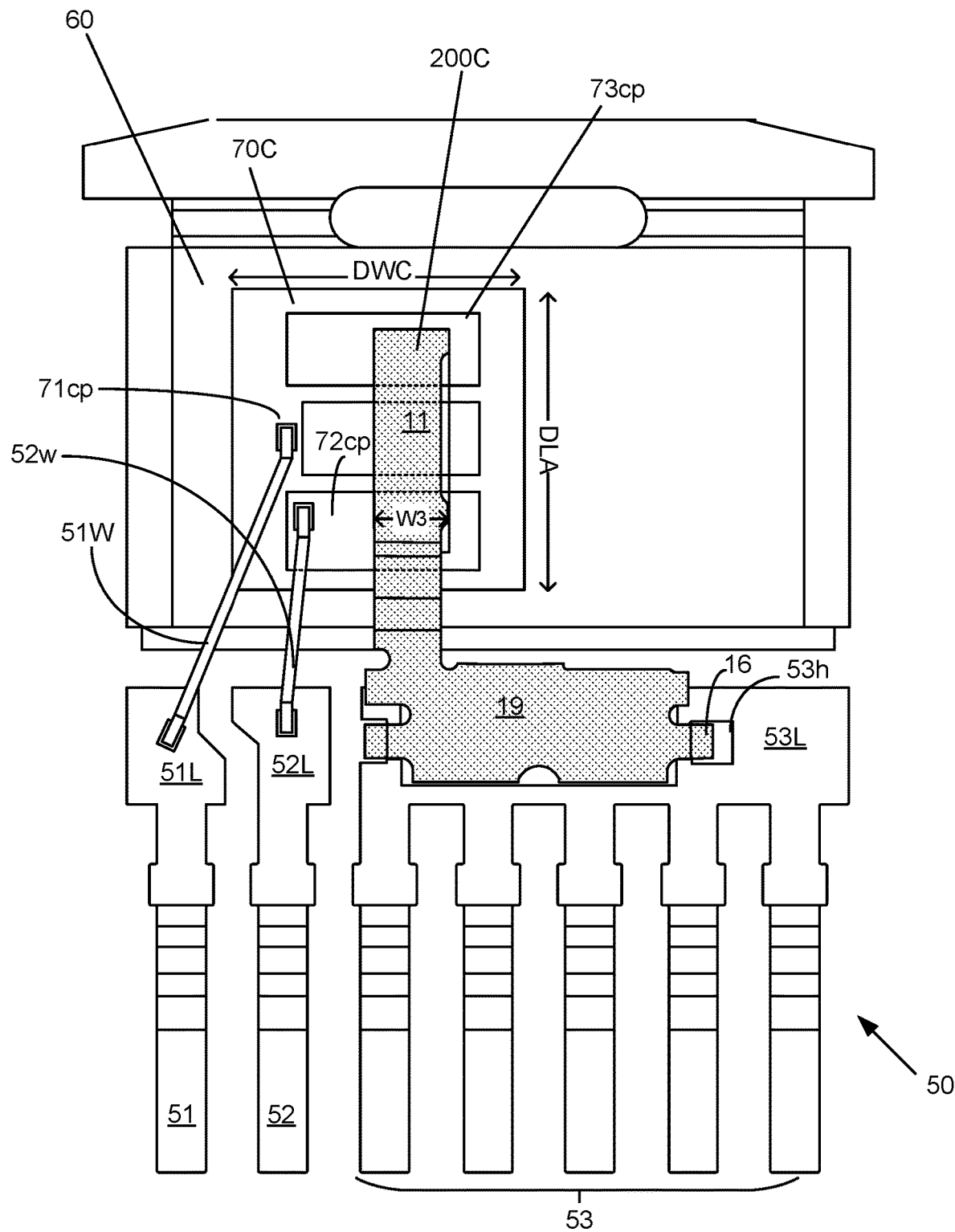

FIGS. 5A-5C illustrate use of clips of different sizes to connect to semiconductor die in a semiconductor device package. The semiconductor device package may, for example, be of an industry-standard package type (e.g., a D2PAK or a DDPAK package, a TO-263 package, etc.).

FIG. 5A shows, in plan view, an example semiconductor package 500A enclosing a semiconductor die (e.g., die 70A). For visual clarity, a molding that may encapsulate the components of semiconductor package 500A is not shown in FIG. 5A.

Semiconductor die 70A (e.g., a MOSFET device with gate, sense, and source contact pads) may, for example, have a rectangular shape with a length DLA and a width DWA.

In semiconductor package 500A, semiconductor die 70A may be mounted on (e.g., bonded to) a die attach pad (DAP) (e.g., DAP 60), and electrical connections may be made between semiconductor die 70A and leads of a lead frame (e.g., a lead frame 50). The leads of the lead frame may include, for example, individual leads (e.g., leads 51 and 52) for electrical connection to gate and sense contact pads (e.g., pads 71*ap* and 72*ap*) on semiconductor die 70A, and a group of leads (e.g., leads 53) for electrical connection to source contact pads (e.g., pad 73*ap*) on semiconductor die 70A. The leads 51, 52, 53 may include lead posts 51L, 52L, 53L providing areas for making the electrical connections to the leads.

In example implementations of package 500A, the gate and sense contact pads (e.g., pads 71*p* and 72*p*) may be electrically connected to leads 51, 52 by wire bonding wires (e.g., wires 51*w*, 52*w*) to lead posts 51L, 52L of leads 51, 52.

Source contact pads (e.g., pad 73*ap*) may be electrically connected to leads 53 by a clip connection to lead post 53L. As shown in FIG. 5A, the clip connection may be made, for example, by using primary clip 200A (FIG. 2A) including a die contact portion 11 having a width W1. Die contact portion 11 may be placed in contact with, and attached to, source contact pads (e.g., pad 73*p*) with aligner structure 19 of primary clip 200A being attached to lead post 53L. In the example shown in FIG. 5A, aligner structure 19 may be attached to lead post 53L, by locking vertical walls or tabs 16 of the aligner structure, for example, in holes 53H in lead post 53L.

Primary clip 200A may be extracted from clip preform 100 for use in semiconductor package 500A in consideration of the widths of the source contact pads (e.g., pad 73*p*) of semiconductor die 70A and width of die contact portion 11 of primary clip 200A, as previously described, for example, in the context of method 400 (steps 440-460, FIG. 4).

FIG. 5B illustrates an example semiconductor package 500B enclosing a semiconductor die (e.g., die 70B) having a smaller size than the size of semiconductor die 70A enclosed in semiconductor package 500A (FIG. 5A). Semiconductor die 70B (e.g., a MOSFET device) may, for example, have a rectangular shape with a length DLA and a width DWB, where DWB is less than the width DWA of semiconductor die 70A. Semiconductor die 70B may include gate and sense contact pads (e.g., pads 71*bp* and 72*bp*) and source contact pads (e.g., pad 73*bp*). Semiconductor package 500B may include the same die attach pad (e.g., DPA 60), and the same leads (e.g., leads 51, 52 and 53) and the same leadframe (e.g., lead frame 50) as semiconductor package 500A for making electrical connections to the enclosed semiconductor die.

In example implementations of package 500B, the gate and sense contact pads (e.g., pads 71*bp* and 72*bp*) may be electrically connected to leads 51, 52 by wire bonding wires (e.g., wires 51*w*, 52*w*) to lead posts 51L, 52L of leads 51, 52.

Source contact pads (e.g., pad 73*bp*) may be electrically connected to leads 53 by a clip connection to lead post 53L. As shown in FIG. 5B, the clip connection may be made, for example, by using secondary clip 200B (FIG. 2B) including a die contact portion 11 having a width W2. Die contact portion 11 may be placed in contact with, and attached to, source contact pads (e.g., pad 73*bp*) with aligner structure 19 of secondary clip 200B being attached to lead post 53L.

Secondary clip 200B may be extracted from clip preform 100 for use in semiconductor package 500B in consideration of the widths of the source contact pads (e.g., pad 73*bp*) of semiconductor die 70B and the width of die contact portion 11 of secondary clip 200B, as previously described, for example, in the context of method 400 (steps 440-460, FIG. 4).

FIG. 5C illustrates another example semiconductor package 500C enclosing a semiconductor die (e.g., die 70C) having a smaller size than the size of semiconductor die 70B enclosed in semiconductor package 500B (FIG. 5B). Semiconductor die 70C (e.g., a MOSFET device) may, for example, have a rectangular shape with a length DLA and a width DWC, where DWC is less than the width DWB of semiconductor die 70B. Semiconductor die 70C may include gate and sense contact pads (e.g., pads 71*cp* and 72*cp*) and source contact pads (e.g., pad 73*cp*). Semiconductor package 500C may include the same die attach pad (e.g., DPA 60), and the same leads (e.g., leads 51, 52 and 53) and the same leadframe (e.g., lead frame 50) as semiconductor packages 500A and 500B for making electrical connections to the enclosed semiconductor die.

In example implementations of package 500C, the gate and sense contact pads (e.g., pads 71*cp* and 72*cp*) may be electrically connected to leads 51, 52 by wire bonding wires (e.g., wires 51*w*, 52*w*) to lead posts 51*p*, 52*p* of leads 51, 52.

Source contact pads (e.g., pad 73*cp*) may be electrically connected to leads 53 by a clip connection to lead post 53L. As shown in FIG. 5C, the clip connection may be made, for example, by using secondary clip 200C (FIG. 2C) including a die contact portion 11 having a width W3. Die contact portion 11 may be placed in contact with, and attached to, source contact pads (e.g., pad 73*cp*) with aligner structure 19 of secondary clip 200C being attached to lead post 53L.

Secondary clip 200C may be extracted from clip preform 100 for use in semiconductor package 500C in consideration of the widths of the source contact pads (e.g., pad 73*cp*) of semiconductor die 70C and the width of die contact portion 11 of secondary clip 200C, as previously described, for example, in the context of method 400 (steps 440-460, FIG. 4).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A clip preform comprising:
a die contact portion having a planar surface configured to contact a surface of a semiconductor die, the die contact portion being disposed at a first distal end of the clip preform;
an aligner structure including a lead contact portion having a planar surface, the aligner structure configured to attach the lead contact portion to a lead post, the aligner structure being disposed at an opposite second distal end of the clip preform; and
an intermediate portion connecting the die contact portion to the lead contact portion in the aligner structure, the die contact portion, the intermediate portion, and the aligner structure of the clip preform forming a structure of a primary clip for connecting the semiconductor die to the lead post,
the clip preform being severable by removing a part of the die contact portion and a part of the intermediate portion of the clip preform to form a secondary clip for connecting the semiconductor die to the lead post,
the aligner structure, a remaining part of the die contact portion, and a remaining part of the intermediate portion of the clip preform forming a structure of the secondary clip.

2. The clip preform of claim 1, wherein the die contact portion in the primary clip has a lateral width perpendicular to a longitudinal axis extending from the first distal end in a direction of the second distal end, and wherein the remaining part of die contact portion in the secondary clip has a smaller lateral width than the lateral width of the die contact portion in the primary clip.

3. The clip preform of claim 1, wherein the aligner structure in the secondary clip to attach the lead contact portion to the lead post has a same structure as the aligner structure in the primary clip.

4. The clip preform of claim 1, wherein the die contact portion, the intermediate portion, and the aligner structure include a stamped sheet of metal.

5. The clip preform of claim 1, further comprising, a singulation guide or marking on the primary clip identifying the part of the die contact portion and the part of the intermediate portion to be removed from the primary clip to form the secondary clip.

6. The clip preform of claim 5 wherein the singulation guide or marking includes at least a slot formed along an edge of the part of the die contact portion and or the part of the intermediate portion to be removed from the primary clip to form the secondary clip.

7. The clip preform of claim 5, wherein the singulation guide or marking includes a guide notch disposed on an edge of the lead contact portion, the guide notch configured to guide a cutting or singulation tool to cut the primary clip along a line perpendicular to the edge.

8. The clip preform of claim 1, wherein a major planar surface of the die contact portion is downset from a major planar surface of the lead contact portion by a distance perpendicular to the major planar surfaces.

9. The clip preform of claim 1, wherein the aligner structure includes vertical walls extending from lateral edges of the lead contact portion, the walls and the lead contact portion forming a cavity configured to hold the lead post.

10. A primary clip comprising:
an aligner structure configured to attach a lead contact portion to a lead post;
a die contact portion configured to contact a surface of a semiconductor die;
the die contact portion having a surface downset from a surface of the lead contact portion, the die contact portion having a first lateral width; and
an intermediate portion connecting the die contact portion to the lead contact portion in the aligner structure,
the primary clip including at least a secondary clip formed by removal of a part of the die contact portion, the die contact portion remaining in the secondary clip having a second lateral width that is smaller than the first lateral width.

11. The primary clip of claim 10, wherein the lead contact portion, the die contact portion, and the intermediate portion comprise a stamped sheet of metal.

12. The primary clip of claim 10, wherein the secondary clip is severable from the primary clip along a longitudinal line extending from a lateral edge of the die contact portion through the intermediate portion toward the lead contact portion and a lateral line through a bottom portion of the lead contact portion.

13. The primary clip of claim 10, further comprising, a singulation guide or marking on a surface of the primary clip identifying the part of the die contact portion and the part of the intermediate portion to be removed from the primary clip to form the secondary clip.

14. The primary clip of claim 13, wherein the singulation guide or marking includes a longitudinal slot aligned with a longitudinal edge of the part of the die contact portion and the part of the intermediate portion to be removed from the primary clip to form the secondary clip.

15. The primary clip of claim 13, wherein the singulation guide or marking includes a guide notch disposed on an edge of the lead contact portion, the guide notch configured to guide a singulation tool to singulate the primary clip along a lateral line perpendicular to the edge.

16. The primary clip of claim 10, further comprising, a pair of tie bars attached to edges of the aligner structure, the tie bars holding the primary clip between a pair of spaced-apart holed runner strips of a clip frame.

17. A clip frame comprising:
a pair of spaced-apart holed runner strips, and
a clip held by tie bars between the pair of spaced-apart holed runner strips, the clip including:
an aligner structure configured to attach a lead contact portion to a lead post;
a die contact portion configured to contact a surface of a semiconductor die,
the die contact portion having a surface downset from a surface of the lead contact portion, the die contact portion having a first lateral width; and
an intermediate portion connecting the die contact portion to the lead contact portion in the aligner structure,
the clip including at least a secondary clip formed by removal of a part of the die contact portion, a remaining die contact portion remaining in the secondary clip having a second lateral width that is smaller than the first lateral width.

18. A method comprising:
receiving a semiconductor die;
receiving a leadframe including a lead post;
receiving a clip frame holding a primary clip by tie bars attached to the primary clip, the primary clip including an aligner structure configured to attach the primary clip to the lead post and a flat die contact portion coupled to the clip aligner structure, the flat die contact portion having a first width, the primary clip being severable into at least a secondary clip, the secondary clip including a part of flat die contact portion having a second width;
determining a width of a contact pad on the semiconductor die;
when the width of the contact pad matches the first width of the flat die contact portion of the primary clip, extracting the primary clip from the clip frame and attaching the primary clip to the contact pad on the semiconductor die; and
when the width of the contact pad matches the second width of the part of flat die contact portion in the secondary clip, extracting the secondary clip from the clip frame and attaching the secondary clip to the contact pad on the semiconductor die.

19. The method of claim 18, wherein extracting the secondary clip from the clip frame includes singulating the primary clip to remove a section of the flat die contact portion in primary clip while keeping the part of flat die contact portion having a second width in the secondary clip.

20. The method of claim 18, wherein extracting the primary clip and the secondary clip from the clip frame includes singulating the tie bars holding the primary clip in the clip frame.

21. The method of claim 18, wherein attaching the primary clip to the semiconductor die and attaching the secondary clip to the semiconductor die include attaching the clip aligner structure to the lead post.

22. The method of claim 18, wherein the contact pad on the semiconductor die is a source contact pad of a device in the semiconductor die.

\* \* \* \* \*